US012630918B2

(12) United States Patent
Kim

(10) Patent No.: US 12,630,918 B2
(45) Date of Patent: May 19, 2026

(54) CONSUMABLE COMPONENT TREATING APPARATUS AND SEMICONDUCTOR MANUFACTURING EQUIPMENT

(71) Applicant: SEMES CO., LTD., Cheonan-si (KR)

(72) Inventor: Sun Il Kim, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 109 days.

(21) Appl. No.: 18/512,324

(22) Filed: Nov. 17, 2023

(65) Prior Publication Data

US 2024/0213006 A1 Jun. 27, 2024

(30) Foreign Application Priority Data

Dec. 27, 2022 (KR) ......................... 10-2022-0185680

(51) Int. Cl.
*C23C 14/50* (2006.01)
*C23C 14/16* (2006.01)
*C23C 14/34* (2006.01)
*C23C 14/54* (2006.01)
*H01J 37/32* (2006.01)

(52) U.S. Cl.
CPC .............. *C23C 14/50* (2013.01); *C23C 14/16* (2013.01); *C23C 14/34* (2013.01); *C23C 14/545* (2013.01); *H01J 37/32715* (2013.01)

(58) Field of Classification Search
CPC . H01J 37/32715; H01J 37/3435; C23C 14/50; C23C 14/16; C23C 14/34; C23C 14/545
See application file for complete search history.

(56) References Cited

U.S. PATENT DOCUMENTS 6,623,563 B2 * 9/2003 Hosokawa .......... C23C 16/4581
219/544
2016/0343552 A1 * 11/2016 Sun ................... H01M 10/0585

FOREIGN PATENT DOCUMENTS

| JP | S5970775 | A | | 4/1984 | |
| JP | 60197875 | A | * | 10/1985 | .......... C23C 14/545 |
| JP | H04224677 | A | | 8/1992 | |
| KR | 20050109766 | A | | 11/2005 | |
| KR | 10-2008-0105367 | A | | 12/2008 | |
| KR | 10-2010-0100531 | A | | 9/2010 | |
| KR | 10-2011-0106930 | A | | 9/2011 | |

(Continued)

OTHER PUBLICATIONS

English Abstract of JP 60197875 (Year: 1985).*
Notice of Allowance for Korean Application No. 10-2022-0185680 dated Feb. 2, 2026.

*Primary Examiner* — Michael A Band
(74) *Attorney, Agent, or Firm* — Harness, Dickey & Pierce, P.L.C.

(57) ABSTRACT

Provided is a consumable component treating apparatus for ensuring coating thickness uniformity and a semiconductor manufacturing equipment including the same. The consumable component treating apparatus comprises a housing; a process gas providing unit for providing process gas to an interior of the housing; a plasma generating unit including a high-frequency power source and for generating plasma inside the housing using the process gas; a holder for fixing a base material; a metal substrate for supporting the holder; and a support module for supporting a target material coated on a base material using the plasma.

14 Claims, 13 Drawing Sheets

(56)    References Cited

FOREIGN PATENT DOCUMENTS

| KR | 10-2020-0126705 A | 11/2020 |
| KR | 20210048901 A | 5/2021 |
| KR | 10-2021-0144446 A | 11/2021 |

* cited by examiner

270

1

CONSUMABLE COMPONENT TREATING APPARATUS AND SEMICONDUCTOR MANUFACTURING EQUIPMENT

This application claims the benefit of Korean Patent Application No. 10-2022-0185680, filed on Dec. 27, 2022, in the Korean Intellectual Property Office, the disclosure of which is incorporated herein by reference in its entirety.

BACKGROUND

1. Field

The present invention relates to a consumable component treating apparatus and a semiconductor manufacturing equipment including the same. More specifically, it relates to a consumable component treating apparatus that treats consumable components using plasma and a semiconductor manufacturing equipment including the same.

2. Description of the Related Art

The semiconductor manufacturing process can be performed continuously within a semiconductor manufacturing equipment and can be divided into pre-process and post-process. Here, the pre-process refers to the process of completing a semiconductor chip by forming a circuit pattern on a wafer, and the post-process refers to the process of evaluating the performance of the product completed through the pre-process.

Semiconductor manufacturing equipment can be installed in a semiconductor manufacturing plant, defined as a fab, to manufacture semiconductors. The wafer can be moved to the equipment where each process is performed to sequentially go through each process for producing a semiconductor, such as deposition process, photolithography process, etching process, ashing process, ion implantation process, cleaning process, packaging process, and inspection process.

Plasma is generated by very high temperatures, strong electric fields, or high-frequency electromagnetic fields (RF electromagnetic fields), and refers to an ionized gas state composed of ions, electrons, radicals, etc. Manufacturing processes using plasma may include etching, physical vapor deposition (PVD), chemical vapor deposition (CVD), ion implantation, and ashing processes.

However, in the case of PVD deposition, there is a difference in mean free path at each position depending on the diameter of the object, making it difficult to secure deposition uniformity between the inner and outer sides.

In addition, since the material is entirely deposited during the process, even in cases where the center is empty, such as a ring type, the entire surface is deposited, so there is a problem of high target loss.

SUMMARY

The technical problem to be solved by the present invention is to provide a consumable component treating apparatus for securing coating thickness uniformity and a semiconductor manufacturing equipment including the same.

The technical objects of the present invention are not limited to the technical objects mentioned above, and other technical objects not mentioned will be clearly understood by those skilled in the art from the description below.

One aspect of the consumable component treating apparatus of the present invention comprises a housing; a process gas providing unit for providing process gas to an interior of the housing; a plasma generating unit including a high-frequency power source and for generating plasma inside the housing using the process gas; a holder for fixing a base material; a metal substrate for supporting the holder; and a support module for supporting a target material coated on a base material using the plasma.

One aspect of the semiconductor manufacturing equipment of the present invention comprises a plurality of process chambers for processing a semiconductor substrate; and a consumable component treating apparatus for treating a consumable component installed in the process chamber, wherein the consumable component treating apparatus comprises a housing; a process gas providing unit for providing process gas to an interior of the housing; a plasma generating unit including a high-frequency power source and for generating plasma inside the housing using the process gas; a holder for fixing the base material; a metal substrate for supporting the holder; and a support module for supporting a target material coated on the base material using the plasma.

Another aspect of an apparatus for treating a consumable component comprises a housing; a process gas providing unit for providing process gas to an interior of the housing; a plasma generating unit including a high-frequency power source and for generating plasma inside the housing using the process gas; a holder for fixing a base material; a metal substrate for supporting the holder; a support module for supporting a target material coated on the base material using the plasma; and a thin film thickness measurement module for measuring a thickness of a coating layer formed on the base material by the target material, wherein the metal substrate is formed to be bent in one direction, and a bending direction of the metal substrate is determined according to a result of measuring the thickness of the coating layer, wherein, when the target material is intensively coated on a center area of the base material, a distance difference is formed between an edge area of the metal substrate and the holder, wherein, when the target material is intensively coated on an edge area of the base material, a distance difference is formed between a center area of the metal substrate and the holder.

Specific details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
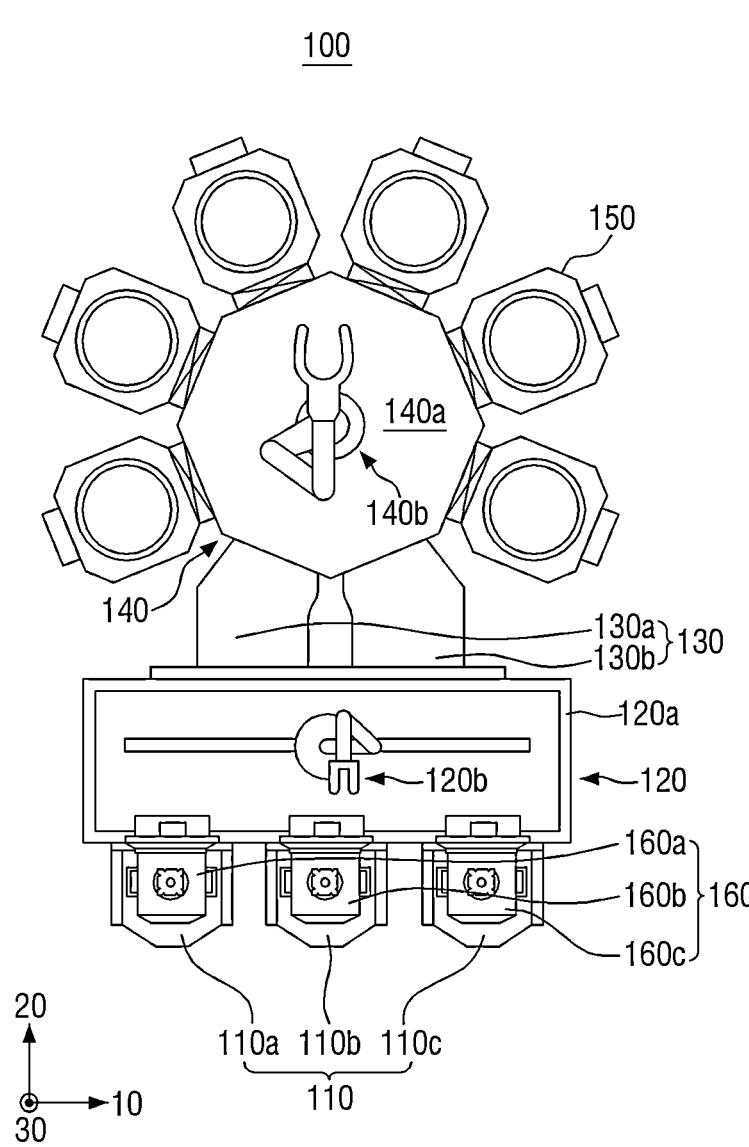
FIG. 1 is a first exemplary diagram schematically showing the internal structure of a semiconductor manufacturing equipment including a substrate processing apparatus using plasma.

Hereinafter, embodiments of the present invention will be described in detail with reference to the attached drawings. The same reference numerals are used for the same components in the drawings, and duplicate descriptions thereof are omitted.

The present invention relates to a consumable component treating apparatus that treats consumable components using plasma and a semiconductor manufacturing equipment including the same. The consumable component treating apparatus of the present invention can perform a physical vapor deposition (PVD) process using plasma, and can ensure thickness uniformity between the inner and outer sides of the coating layer. Hereinafter, the present invention will be described in detail with reference to the drawings.

FIG. 1 is a first exemplary diagram schematically showing the internal structure of a semiconductor manufacturing equipment including a substrate processing apparatus using plasma. According to FIG. 1, the semiconductor manufacturing equipment 100 may be configured to comprise a load port unit 110, an index module 120, a load lock chamber 130, a transfer module 140, and a process chamber 150.

The semiconductor manufacturing equipment 100 is a system that processes semiconductor substrates through various processes such as deposition process, etching process, cleaning process, and heat treatment process. For this purpose, the semiconductor manufacturing equipment 100 may be provided as a multi-chamber type substrate processing system including a plurality of process chambers 150 of the same or different types, such as a chamber for performing a deposition process, a chamber for performing an etching process, a chamber for performing a cleaning process, and a chamber for performing a heat treatment process.

A load port unit 110 is provided so that the container 160 on which a plurality of semiconductor substrates is mounted can be seated. In the above, the container 160 may be, for example, a front opening unified pod (FOUP).

The container 160 may be loaded or unloaded in the load port unit 110. Additionally, the semiconductor substrate stored in the container 160 may be loaded or unloaded in the load port unit 110.

In the former case, the container 160 may be loaded or unloaded into the load port unit 110 by a container transport device. Specifically, the container 160 may be loaded into the load port unit 110 by seating the container 160 that the container transport device has transported on the load port unit 110, and the container 160 may be unloaded into the load port unit 110 by the container transport device gripping the container 160 placed on the load port unit 110. In the above, the container transport device, although not shown in FIG. 1, may be, for example, an overhead hoist transporter (OHT).

In the latter case, the semiconductor substrate may be loaded or unloaded from the container 160 seated on the load port unit 110 by the substrate transfer robot 120b. When the container 160 is seated on the load port unit 110, the substrate transfer robot 120b approaches the load port unit 110 and can then remove the semiconductor substrate from the container 160. Unloading of the semiconductor substrate can be accomplished through this process.

Additionally, when the processing of the semiconductor substrate is completed in the process chamber 150, the substrate transfer robot 120b may remove the semiconductor substrate from the load lock chamber 130 and bring it into the container 160. Loading of the semiconductor substrate can be accomplished through this process.

A plurality of load port units 110 may be disposed in front of the index module 120. For example, three load port units 110a, 110b, and 110c, including a first load port 110a, a second load port 110b, and a third load port 110c, may be disposed in front of the index module 120.

When a plurality of load port units 110 are disposed in front of the index module 120, the containers 160 seated on each load port unit 110 may load different types of objects. For example, when three load port units 110 are disposed in front of the index module 120, the first container 160a, which is seated on the first load port 110a on the left, may be equipped with a wafer-type sensor. The second container 160b, which is seated on the second load port 110b in the center, may be equipped with a substrate (wafer), and the third container 160b, which is seated on the third load port 110c on the right, may be equipped with consumable components such as a focus ring and an edge ring.

However, this embodiment is not limited to this. The containers 160a, 160b, and 160c seated on each load port 110a, 110b, and 110 may load objects of the same type. Alternatively, it is possible for containers seated on several load ports to load objects of the same type, and containers seated on several other load ports to load objects of different types.

The index module 120 is disposed between the load port unit 110 and the load lock chamber 130, and serves as an interface to transfer the semiconductor substrate between the container 160 on the load port unit 110 and the load lock chamber 130. For this purpose, the index module 120 may include a substrate transfer robot 120b in charge of transferring the substrate within the module housing 120a. The substrate transfer robot 120b may operate in an atmospheric pressure environment and may be provided at least one within the module housing 120a.

Although not shown in FIG. 1, at least one buffer chamber may be provided within the index module 120. In the buffer chamber, unprocessed substrates may be temporarily stored before being transferred to the load lock chamber 130, and processed substrates may be temporarily stored before being transported into the container 160 on the load port unit 110. The buffer chamber may be provided on a side wall that is not adjacent to the load port unit 110 or the load lock chamber 130, but is not limited to this, and may also be provided on a side wall adjacent to the load lock chamber 130.

In this embodiment, a front end module (FEM) may be provided on one side of the load lock chamber 130. The front end module (FEM) may include a load port unit 110, an index module 120, etc., and may be provided as an Equipment Front End Module (EFEM), SFEM, etc.

Meanwhile, the plurality of load ports 110*a*, 110*b*, and 110*c* have a structure arranged in the horizontal direction (first direction 10) in the example of FIG. 1, but the present embodiment is not limited to this and it is also possible to have a structure, in which the plurality of load ports 110*a*, 110*b*, 110*c* are stacked in a vertical direction. In this case, the front end module can be provided, for example, as a vertically stacked EFEM.

The load lock chamber 130 is also called a buffer chamber and functions as a buffer chamber between the input port and output port on the semiconductor manufacturing equipment 100. Although not shown in FIG. 1, the load lock chamber 130 may include a buffer stage in which a semiconductor substrate temporarily stands by.

A plurality of load lock chambers 130 may be disposed between the index module 120 and the transfer module 140. For example, two load locks 130*a* and 130*b*, such as a first load lock 130*a* and a second load lock 130*b*, may be disposed between the index module 120 and the transfer module 140.

The first load lock 130*a* and the second load lock 130*b* may be arranged in the horizontal direction (first direction 10) between the index module 120 and the transfer module 140. In this case, the first load lock 130*a* and the second load lock 130*b* may be arranged in the same direction as the arrangement direction of the plurality of load ports 110*a*, 110*b*, and 110*c*, and may be provided as a mutual symmetrical single-layer structure arranged side by side in the horizontal direction. In the above, the first direction 10 refers to a direction perpendicular to the arrangement direction (second direction 20) of the index module 120 and the transfer module 140.

However, this embodiment is not limited to this. The first load lock 130*a* and the second load lock 130*b* can also be arranged in the vertical direction (third direction 30) between the index module 120 and the transfer module 140. In this case, the first load lock 130*a* and the second load lock 130*b* may be provided in a multi-layer structure arranged in the vertical direction. In the above, the third direction 30 refers to a direction perpendicular to the plane consisting of the arrangement direction of the plurality of load ports 110*a*, 110*b*, and 110*c* (i.e., the first direction 10) and the arrangement direction of the index module 120 and the transfer module 140. (i.e., the second direction 20).

The first load lock 130*a* may transfer the semiconductor substrate from the index module 120 to the transfer module 140, and the second load lock 130*b* may transfer the semiconductor substrate from the transfer module 140 to the index module 120. However, this embodiment is not limited to this. The first load lock 130*a* may perform both the role of transferring the substrate from the transfer module 140 to the index module 120 and the role of transferring the substrate from the index module 120 to the transfer module 140, and similarly, the second load lock 130*b* may also perform both the role of transferring a substrate from the transfer module 140 to the index module 120 and the role of transferring a substrate from the index module 120 to the transfer module 140.

A semiconductor substrate may be loaded or unloaded into the load lock chamber 130 by the substrate transfer robot 140*b* of the transfer module 140. A semiconductor substrate may be loaded or unloaded into the load lock chamber 130 by the substrate transfer robot 120*b* of the index module 120.

As previously described, a substrate transfer robot 120*b* may be provided within the index module 120, and as will be described later, a substrate transfer robot 140*b* may also be provided within the transfer module 140. In this embodiment, the substrate transfer robot 120*b* provided in the index module 120 is defined as the first transfer robot, and the substrate transfer robot 140*b* provided in the transfer module 140 is defined as the second transfer robot, and the two substrate transfer robots 120*b* and 140*b* will be distinguished.

The load lock chamber 130 can maintain pressure while changing its interior to a vacuum environment and an atmospheric pressure environment using a gate valve, etc. Through this, the load lock chamber 130 can prevent the internal air pressure state of the transfer module 140 from changing.

Specifically, when a substrate is loaded or unloaded by the substrate transfer robot 140*b* of the transfer module 140, the inside of the load lock chamber 130 may be formed as a vacuum environment that is the same as (or close to) that of the transfer module 140. In addition, when a substrate is loaded or unloaded by the substrate transfer robot 120*b* of the index module 120, the inside of the load lock chamber 130 may be formed as an atmospheric pressure environment equal to (or close to) that of the index module 120.

The transfer module 140 serves as an interface so that the semiconductor substrate can be transferred between the load lock chamber 130 and the process chamber 150. For this purpose, the transfer module 140 may be equipped with a substrate transport robot 140*b* in charge of transferring the substrate within the module housing 140*a*. The substrate transfer robot 140*b* may operate in a vacuum environment and may be provided at least one within the module housing 140*a*.

The substrate transfer robot 140*b* transfers an unprocessed substrate from the load lock chamber 130 to the process chamber 150 or transfers a processed substrate from the process chamber 150 to the load lock chamber 130. Each side of the transfer module 140 may be connected to the load lock chamber 130 and a plurality of process chambers 150 for this purpose. Meanwhile, the substrate transfer robot 140*b* can be freely rotated.

The process chamber 150 serves to process the substrate. A plurality of process chambers 150 may be disposed around the transfer module 140. In this case, each process chamber 150 may receive a semiconductor substrate from the transfer module 140, process the semiconductor substrate, and provide the processed semiconductor substrate to the transfer module 140.

The process chamber 150 may be provided in a cylindrical shape. This process chamber 150 may be made of alumite with an anodic oxide film formed on its surface, and its interior may be airtight. Meanwhile, the process chamber 150 may be formed in a shape other than the cylindrical shape in this embodiment.

The semiconductor manufacturing equipment 100 may be formed in a structure having a cluster platform. In this case, the plurality of process chambers 150 may be arranged in a cluster based on the transfer module 140, and when the load lock chamber 130 is provided with a plurality of load locks 130a and 130b, they can be arranged in the first direction 10.

Figure 2:
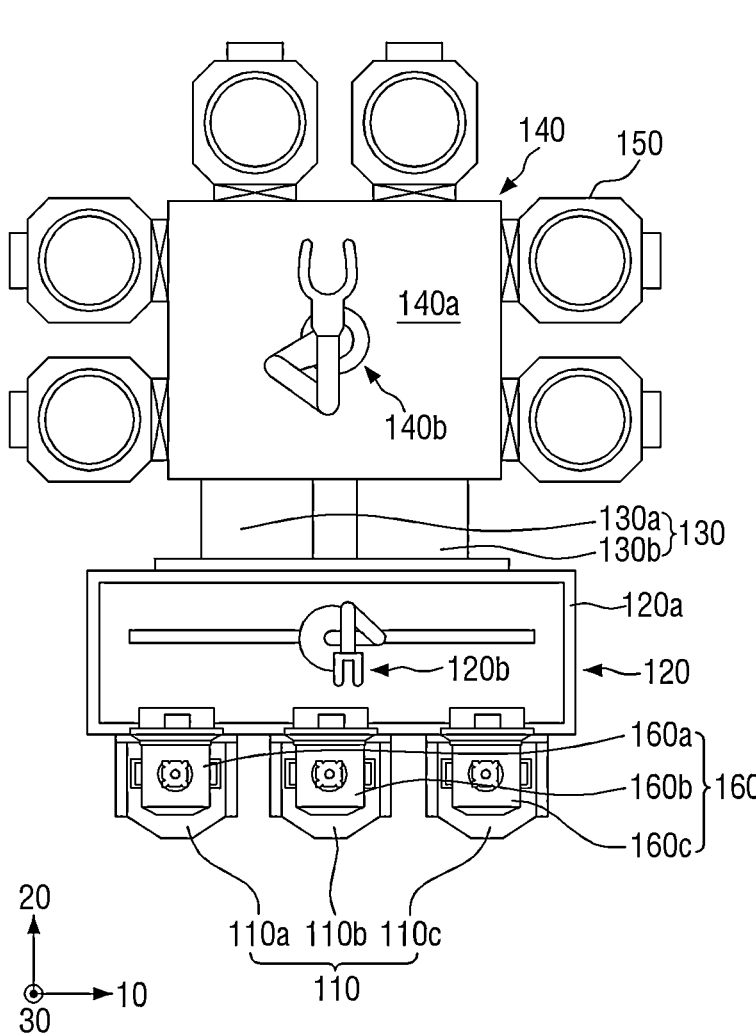
FIG. 2 is a second exemplary diagram schematically showing the internal structure of a semiconductor manufacturing equipment including a substrate processing apparatus using plasma.

However, this embodiment is not limited to this. The semiconductor manufacturing equipment 100 can also be formed in a structure having a quad platform as shown in FIG. 2. In this case, the plurality of process chambers 150 may be arranged in a quad manner based on the transfer module 140. FIG. 2 is a second exemplary diagram schematically showing the internal structure of a semiconductor manufacturing equipment including a substrate processing apparatus using plasma.

Figure 3:
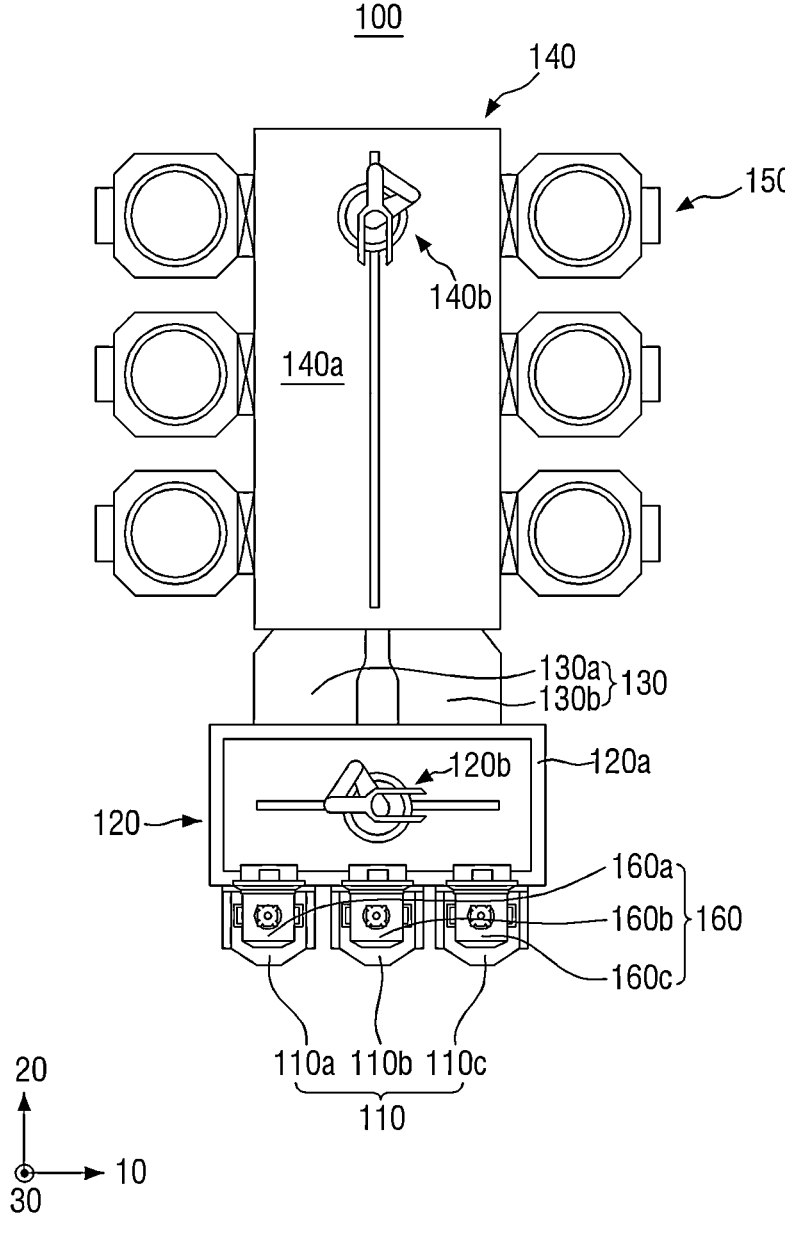
FIG. 3 is a third exemplary diagram schematically showing the internal structure of a semiconductor manufacturing equipment including a substrate processing apparatus using plasma.

The semiconductor manufacturing equipment 100 can also be configured in a structure having an in-line platform as shown in FIG. 3. In this case, the plurality of process chambers 150 may be arranged an in-line manner with respect to the transfer module 140, and two different process chambers 150 on both sides of the transfer module 140 may form a corresponding relationship and be arranged in series. FIG. 3 is a third exemplary diagram schematically showing the internal structure of a semiconductor manufacturing equipment including a substrate processing apparatus using plasma.

Although not shown in FIGS. 1 to 3, the semiconductor manufacturing equipment 100 may further include a control device. The control device serves to control the overall operation of each module constituting the semiconductor manufacturing equipment 100. For example, the control device may control the loading and unloading of substrates by the substrate transfer robot 120b of the index module 120 and the substrate transfer robot 140b of the transfer module 140, and control the substrate processing process of the process chamber 150.

The control device may include a process controller comprising a microprocessor (computer) that controls the semiconductor manufacturing equipment 100, a user interface including a keyboard that allows the operator to perform command input manipulations to manage the semiconductor manufacturing equipment 100 and a display that visualizes and displays the operating status of the semiconductor manufacturing equipment 100, a control program for executing the processing performed in the semiconductor manufacturing equipment 100 under the control of a process controller, and a memory unit, in which a program for executing processing for each configuration unit according to various data and processing conditions, that is, a processing recipe, is stored. Additionally, the user interface and memory unit may be connected to the process controller. The processing recipe may be stored in a memory medium in the memory unit, and the memory medium may be a hard disk, a portable disk such as a CD-ROM or DVD, or a semiconductor memory such as a flash memory.

Next, the process chamber 150 provided in the semiconductor manufacturing equipment 100, that is, a consumable component treating apparatus capable of treating consumable parts installed in the substrate processing apparatus will be described. The consumable component treating apparatus of the present invention can treat consumable components using plasma.

Figure 4:
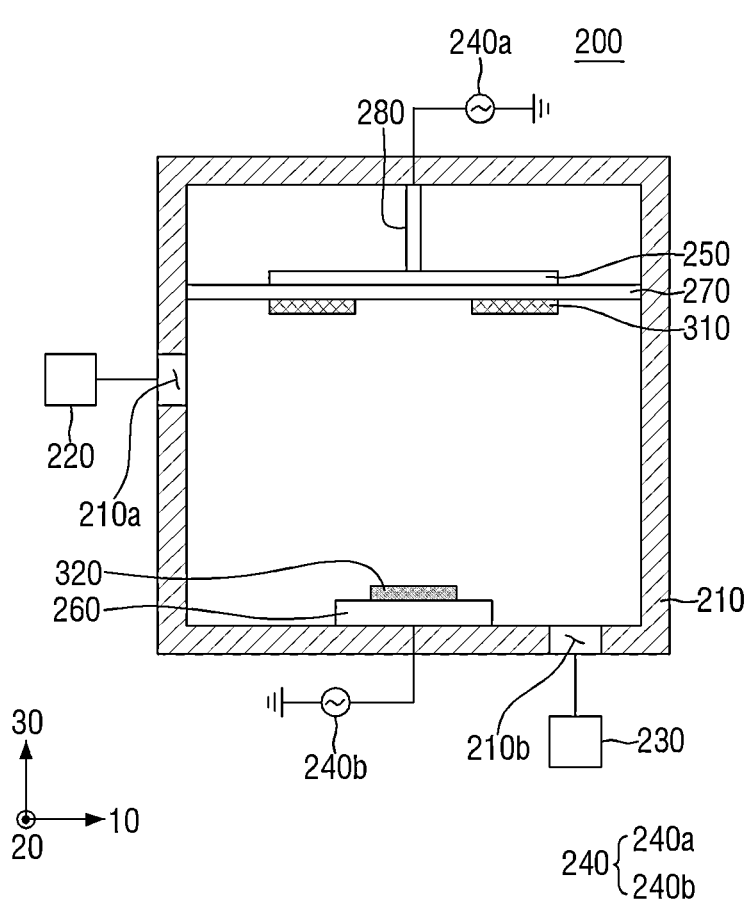
FIG. 4 is a diagram schematically showing the internal configuration of a consumable component treating apparatus using plasma.

FIG. 4 is a diagram schematically showing the internal configuration of a consumable component treating apparatus using plasma. According to FIG. 4, the consumable component treating apparatus 200 includes a chamber housing 210, a process gas providing unit 220, an exhaust unit 230, a plasma generating unit 240, a metal substrate 250, a support module 260 and a holder 270.

The consumable component treating apparatus 200 may be provided as a PVD chamber that performs a physical vapor deposition (PVD) process, and may treat consumable components such as focus rings and edge rings for the purpose of anti-plasma coating. The consumable components treated by the consumable component treating apparatus 200 may be installed as consumables in the process chamber 150 shown in FIGS. 1 to 3, that is, the substrate processing apparatus. Although the consumable component treating apparatus 200 is not shown in FIGS. 1 to 3, it may be included in a semiconductor manufacturing equipment and may be provided separately from the plurality of process chambers 150.

As will be described later, the base material refers to a consumable component installed in the process chamber 150 for substrate (e.g., wafer) processing. However, it is not limited to this, and the base material may also be a wafer. In this case, the consumable component treating apparatus 200 may process the substrate using a PVD process.

The chamber housing 210 serves to provide a space where consumable components are treated. The chamber housing 210 may be provided so that a vacuum is formed therein, and may be provided as a PVD coating chamber.

The chamber housing 210 may include a first hole 210a on one side and a second hole 210b on the other side. The first hole 210a is provided to allow the process gas to introduce into the interior of the chamber housing 210, and the second hole 210b is provided so that by-products generated from the reaction between the consumable components and the process gas or process gases that do not react with the consumable components can be discharged. For example, the first hole 210a may be provided on the side wall of the chamber housing 210, and the second hole 210b may be provided on the bottom surface of the chamber housing 210. However, in this embodiment, the positions of first hole 210a and the second hole 210b are not necessarily limited thereto.

The process gas providing unit 220 serves to provide process gas used to treat consumable components. The process gas providing unit 220 is connected to the first hole 210a of the chamber housing 210 and can introduce process gas into the interior of the chamber housing 210 through the first hole 210a.

The exhaust unit 230 serves to discharge by-products generated through treating of consumable components or process gas remaining inside the chamber housing 210 even after treating of consumable components to the outside. The exhaust unit 230 is connected to the second hole 210b of the chamber housing 210 and may exhaust the by-products or the process gas discharged through the second hole 210b to the outside of the chamber housing 210.

The plasma generating unit 240 generates plasma inside the chamber housing 210 to treat consumable components. For this purpose, the plasma generating unit 240 may include a first high-frequency power source 240a and a second high-frequency power source 240b.

The first high-frequency power source 240a serves to apply RF power to the first electrode. In the above, the first electrode may be a metal substrate 250. A base material 310 may be disposed on this metal substrate 250.

The first high-frequency power source 240a may be provided in singular in the consumable component treating apparatus 200, but is not limited to this and may be provided in plural. When a plurality of first high-frequency power sources 240a are provided, the consumable component treating apparatus 200 may include a matching network electrically connected to the plurality of first high-frequency power sources.

The first high-frequency power source 240a may be connected to the first electrode through a transmission line of a predetermined length. A circuit for impedance matching may be provided on the transmission line connecting the first high-frequency power source 240a and the first electrode.

The second high-frequency power source 240b serves to apply RF power to the second electrode. In the above, the second electrode may be the support module 260. A target material 320 may be placed on the support module 260.

The second high-frequency power source 240b may be provided in singular in the consumable component treating apparatus 200, but is not limited to this, and may be provided in plural. When a plurality of second high-frequency power sources 240b are provided, the consumable component treating apparatus 200 may include a matching network electrically connected to the plurality of second high-frequency power sources.

The second high-frequency power source 240b may be connected to the second electrode through a transmission line of a predetermined length. A circuit for impedance matching may be provided on the transmission line connecting the second high-frequency power source 240b and the second electrode.

In this embodiment, the first electrode (i.e., metal substrate 250) and the second electrode (i.e., support module 260) may be connected to the first high-frequency power source 240a and the second high-frequency power source 240b, respectively. In this case, a (+) electrode may be formed on the first electrode and a (−) electrode may be formed on the second electrode. However, it is not limited to this, and a (−) electrode may be formed on the first electrode and a (+) electrode may be formed on the second electrode.

Additionally, only one of the first electrode and the second electrode may be connected to the high frequency power source. For example, the first electrode may be connected to the first high frequency power source 240a and the second electrode may be GND. Alternatively, the second electrode may be connected to the second high-frequency power source 240b and the first electrode may be GND.

The metal substrate 250 is provided inside the chamber housing 210 and serves to support the base material 310. The metal substrate 250 may support the base material 310 through the holder 270, and it may have the same diameter as the diameter of the base material 310 or may have a diameter wider than the diameter of the base material 310 so that the target material 320 can be smoothly deposited on the base material 310.

Figure 5:
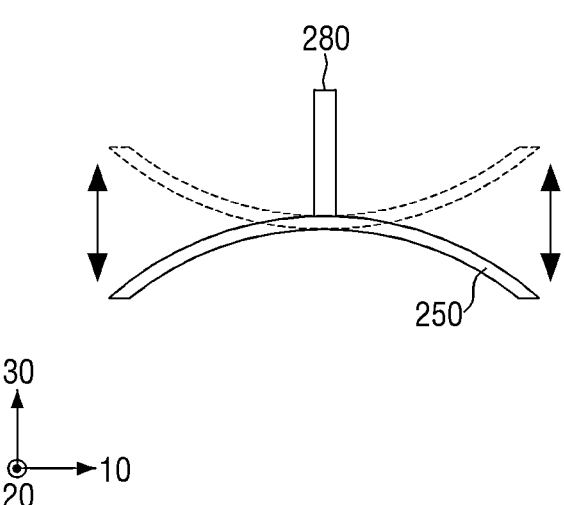
FIG. 5 is a first example diagram for explaining the characteristics of a metal substrate constituting a consumable component treating apparatus using plasma.

The metal substrate 250 may be provided to have flexibility as shown in the example of FIG. 5, and may be formed by including a flexible metal material, such as aluminum (Al), copper (Cu), iron (Fe), etc. The metal substrate 250 may be formed of any flexible metal, but is not limited to this and may also be formed by mixing a plurality of metals. FIG. 5 is a first example diagram for explaining the characteristics of a metal substrate constituting a consumable component treating apparatus using plasma.

This will be described again with reference to FIG. 4.

The support module 260 is provided inside the chamber housing 210 and serves to support the target material 320. The support module 260 may be installed at a position corresponding to the metal substrate 250 inside the chamber housing 210. For example, if the metal substrate 250 is placed on the upper part of the chamber housing 210, the support module 260 may be placed on the lower part of the chamber housing 210.

Figure 6:
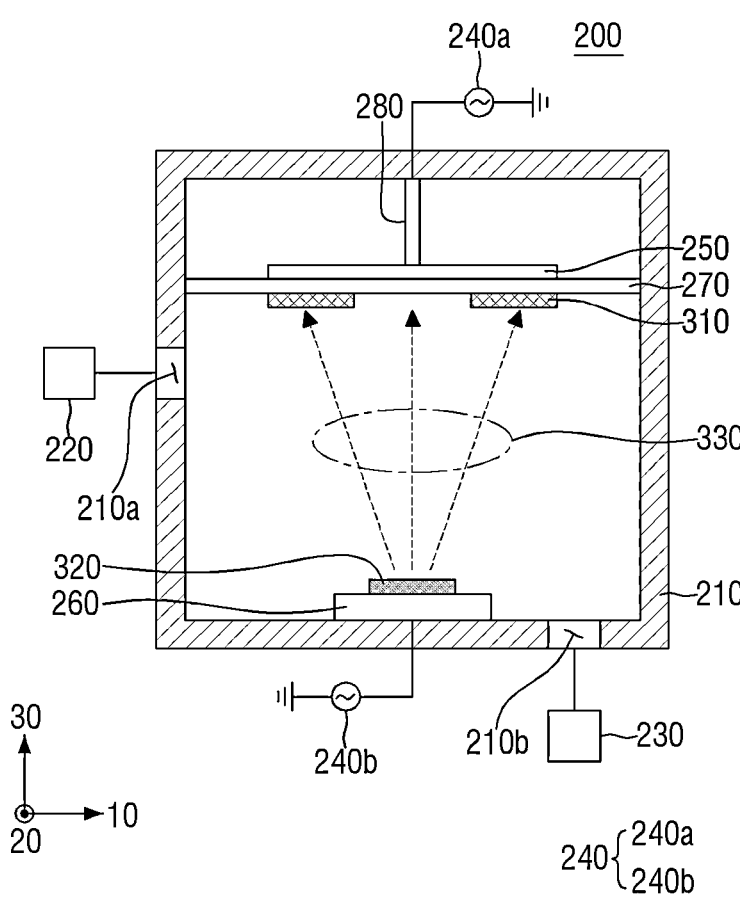
FIG. 6 is an example diagram for explaining the operating principle of a consumable component treating apparatus using plasma.

The consumable component treating apparatus 200 may process a substrate using a sputtering method, that is, a PVD sputtering deposition technique. Here, the PVD sputtering deposition technique refers to a method of depositing the target material 320 on the base material 310 on the anode substrate, that is, the metal substrate 250 by forming plasma 330 inside the chamber housing 210, as shown in the example of FIG. 6, and then colliding ions with the target material 320 connected to the cathode. FIG. 6 is an example diagram for explaining the operating principle of a consumable component treating apparatus using plasma.

Figure 7:
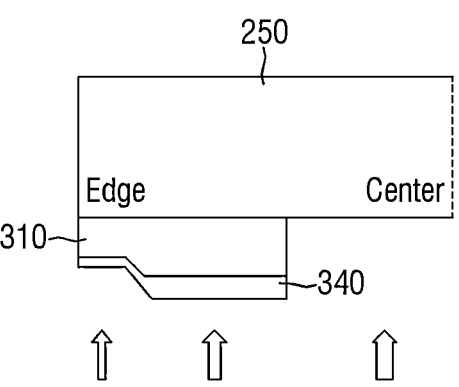
FIG. 7 is a first example diagram for explaining coating thickness uniformity on the base material.

However, the particles separated from the target material 320 move straight in the direction where the metal substrate 250 is located, and when the distance increases compared to the area where the distance is close, the mean free path increases, and deposition efficiency decreases. Therefore, as shown in the example of FIG. 7, a thickness deviation of the coating layer 340 occurs between the inner and outer sides depending on the size of the base material 310, and generally non-uniformity occurs, in which the inner thickness of the coating layer 340 closer to the target material 320 is formed to be higher. FIG. 7 is a first example diagram for explaining coating thickness uniformity on the base material.

The purpose of the present invention is to keep the mean free path, which is inevitably generated depending on the distance from the target material 320 or the shape of the metal substrate 250, constant within the range of the base material 310. Accordingly, the consumable component treating apparatus 200 of the present invention may include a metal substrate 250 and a holder 270 inside the chamber housing 210.

The holder 270 serves to fix the base material 310. The holder 270 may be disposed between the metal substrate 250 and the base material 310 for this purpose.

As described above, the metal substrate 250 may be provided to have flexibility. However, if the metal substrate 250 is provided in this way, the base material 310 cannot be fixed. Therefore, in this embodiment, the holder 270 is configured as a chamber component to fix the base material 310.

The holder 270 may fix the base material 310 using a jig type clamp, bolting, etc. In this embodiment, the base material 310 may be a solid material such as ceramic or metal. Meanwhile, the target material 320 may be a material such as Y2O3, YF3, or YOF.

Figure 8:
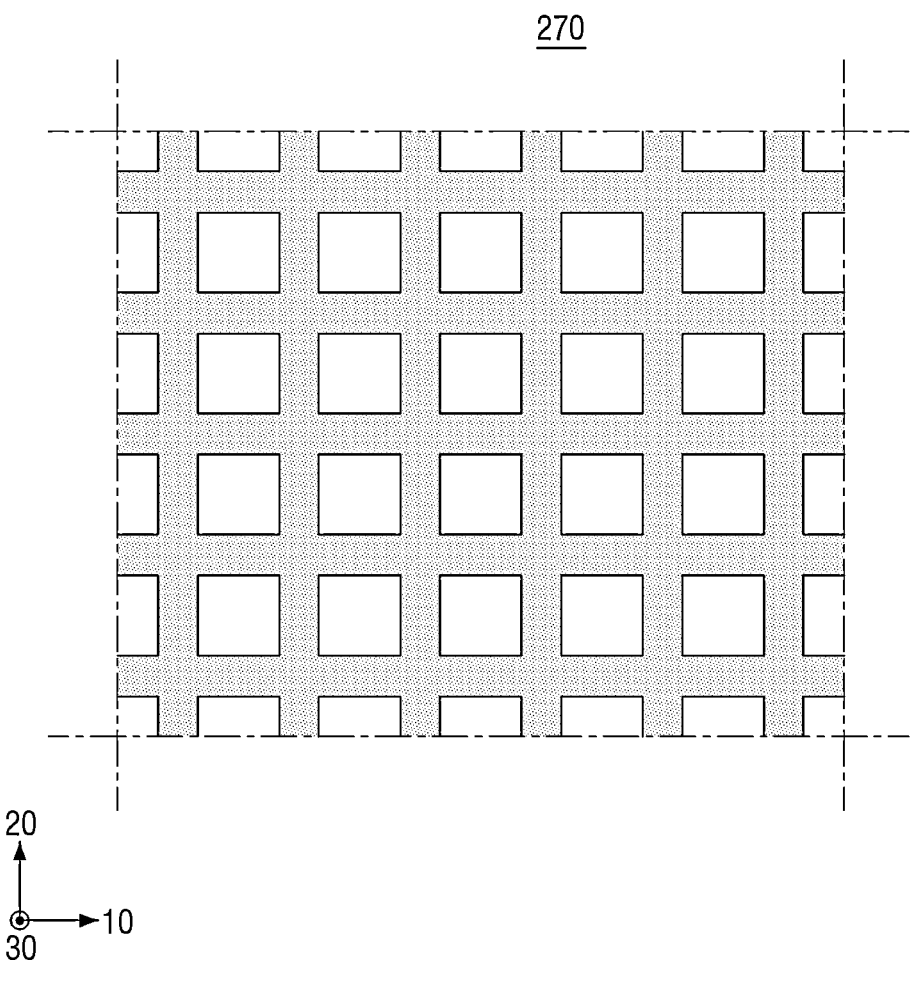
FIG. 8 is an example diagram for explaining the characteristics of a holder constituting a consumable component treating apparatus using plasma.

The holder 270 may be manufactured in a mesh form as shown in the example of FIG. 8 in order to maximize the effect of the metal substrate 250 on material deposition (i.e., to minimize blocking). If the holder 270 is made of a metal material, it may cause electrical interference, so it may be limited to Al2O3, which is a ceramic component. FIG. 8 is an example diagram for explaining the characteristics of a holder constituting a consumable component treating apparatus using plasma.

The present invention can form an intensive/relief area of the mean free path by controlling the curvature of the metal substrate 250, and thus can respond to the ring-shaped base material 310 or intensive coating in the center area.

If an inclined or stepped area exists in the base material 310 on which the target material 320 is to be deposited, the deposition rate may decrease relative to the flat part, and thickness uniformity over the entire area may decrease. Additionally, even if the base material 310 has a ring shape with an empty central area, deposition is performed equally on the entire surface, which may result in unnecessary waste of the target material 320.

To improve this vulnerability, the metal substrate 250 can be orbited and rotated. Alternatively, the metal substrate 250 can be disposed by tilting it at a specific angle. However, supplementation of step coverage by position is still necessary, and a structural approach is required to respond to various shapes.

Figure 9:
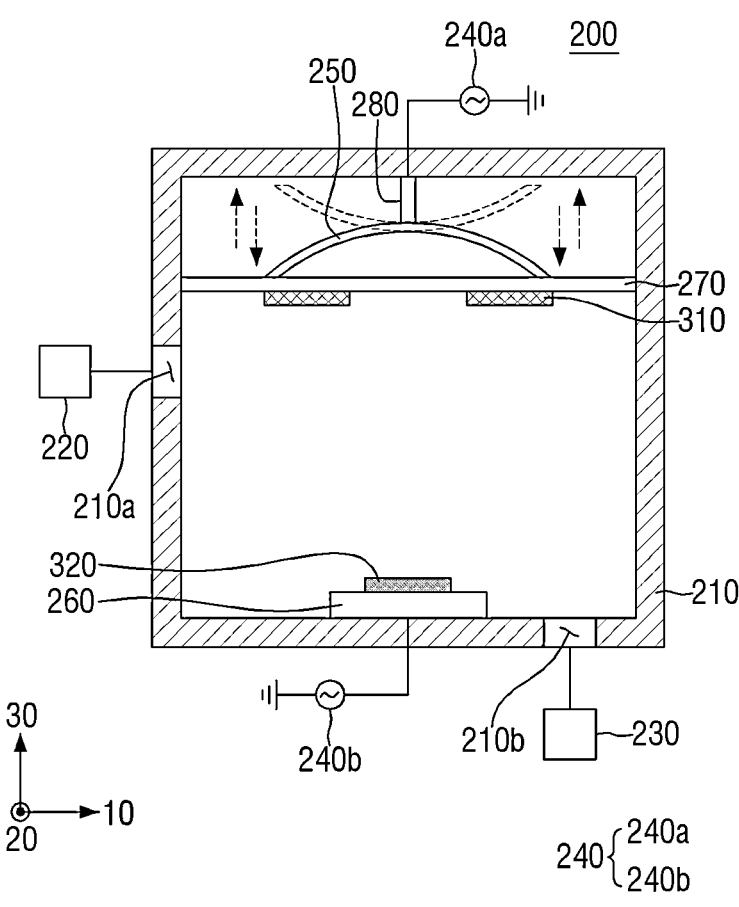
FIG. 9 is an example diagram for explaining the characteristics of a support shaft constituting a consumable component treating apparatus using plasma.

The metal substrate 250 may be supported by a support shaft 280. When the metal substrate 250 is curved, a difference in distance from the base material 320 may occur. In this case, the support axis 280 at the center of the electrode moves in the vertical direction (the third direction 30) as shown in the example of FIG. 9, and the optimal deposition distance can be maintained.

In addition, the optimal curvature of the metal substrate 250 for improving PVD deposition efficiency according to product shape and diameter can be determined by the difference in distance between the metal substrate 250 and the holder 270. FIG. 9 is an example diagram for explaining the characteristics of a support shaft constituting a consumable component treating apparatus using plasma.

Figure 10:
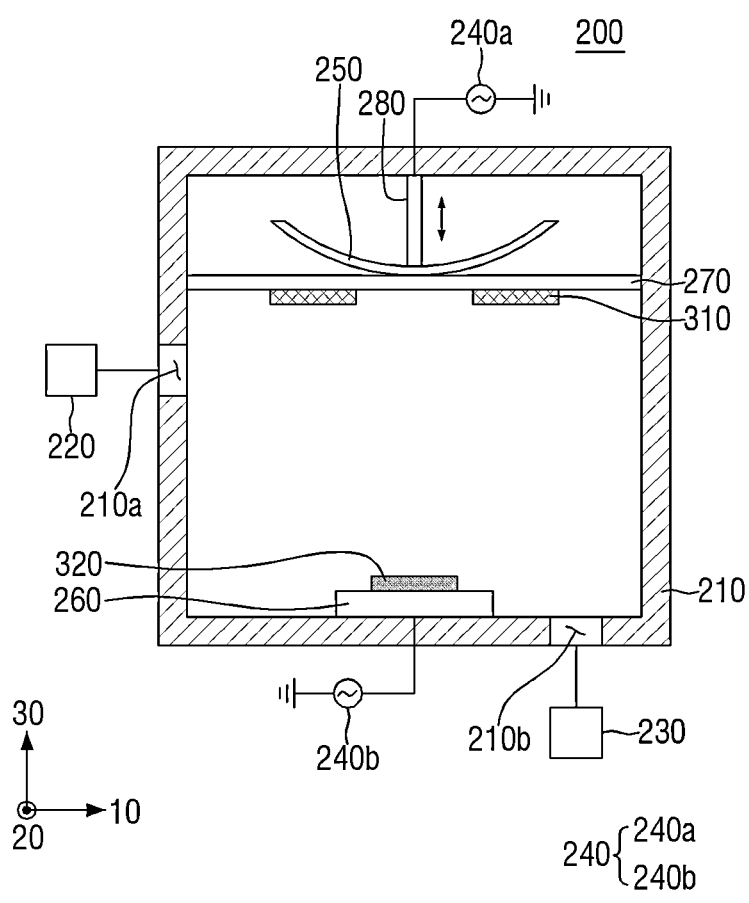
FIG. 10 is a second example diagram for explaining the characteristics of a metal substrate constituting a consumable component treating apparatus using plasma.

FIG. 10 is a second example diagram for explaining the characteristics of a metal substrate constituting a consumable component treating apparatus using plasma. The following description refers to FIG. 10.

When the metal substrate 250 is formed in the shape shown in the example of FIG. 10, the electrode at the edge is moved away from the target material 320, thereby enabling intensive coating in the center area. In this case, the gap between the edge portion of the metal substrate 250 and the holder 270 may be 0 cm to 50 cm. If the metal substrate 250 and the holder 270 are further apart, the curvature of the center area increases and only very localized coating can be performed in the center area.

Figure 11:
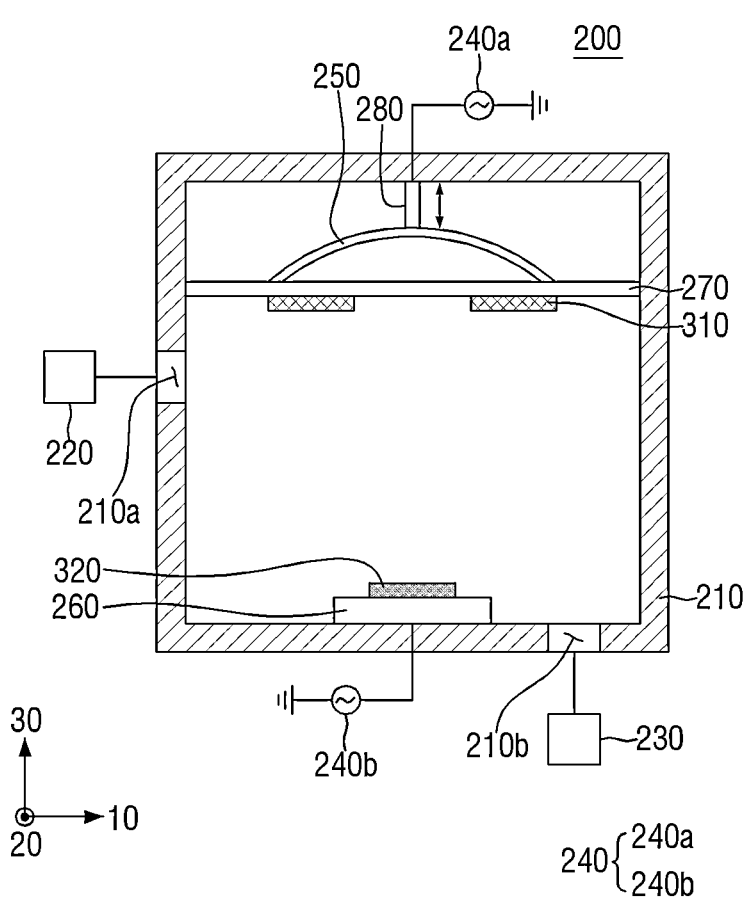
FIG. 11 is a third example diagram for explaining the characteristics of a metal substrate constituting a consumable component treating apparatus using plasma.

FIG. 11 is a third example diagram for explaining the characteristics of a metal substrate constituting a consumable component treating apparatus using plasma. The following description refers to FIG. 11.

When the metal substrate 250 is formed in the shape shown in the example of FIG. 11, the center area is moved away from the target material 320, thereby enabling intensive coating on the edge area. In this embodiment, this structure of the metal substrate 250 can be applied when the base material 310 has a ring shape.

In the above case, the distance between the center portion of the metal substrate 250 and the holder 270 may be 0 cm to 50 cm. If the metal substrate 250 and the holder 270 are further apart, the curvature of the edge area increases and only very localized coating may be performed in the edge area.

Figure 12:
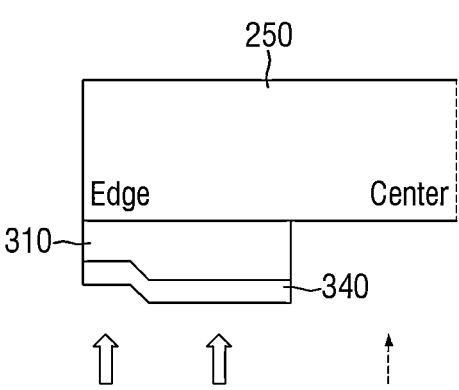
FIG. 12 is a second example diagram for explaining coating thickness uniformity on the base material.

With reference to FIGS. 9 to 11, the adjustment of the curvature of the flexible metal substrate 250, that is, the flexible substrate, has been described. As shown in the example of FIG. 12, the coating thickness uniformity of the base material 310 having inclinations and steps can be improved, and coating intensive and relief areas can be formed to correspond to a specific shape (e.g., ring shape) of the base material 310. FIG. 12 is a second example diagram for explaining coating thickness uniformity on the base material.

Meanwhile, in this embodiment, the thickness of the coating layer 340 formed on the base material 310 is measured at regular intervals to change the shape of the metal substrate 250 to the form shown in the example of FIG. 10, or to the form shown in the example of FIG. 11. The

Figure 13:
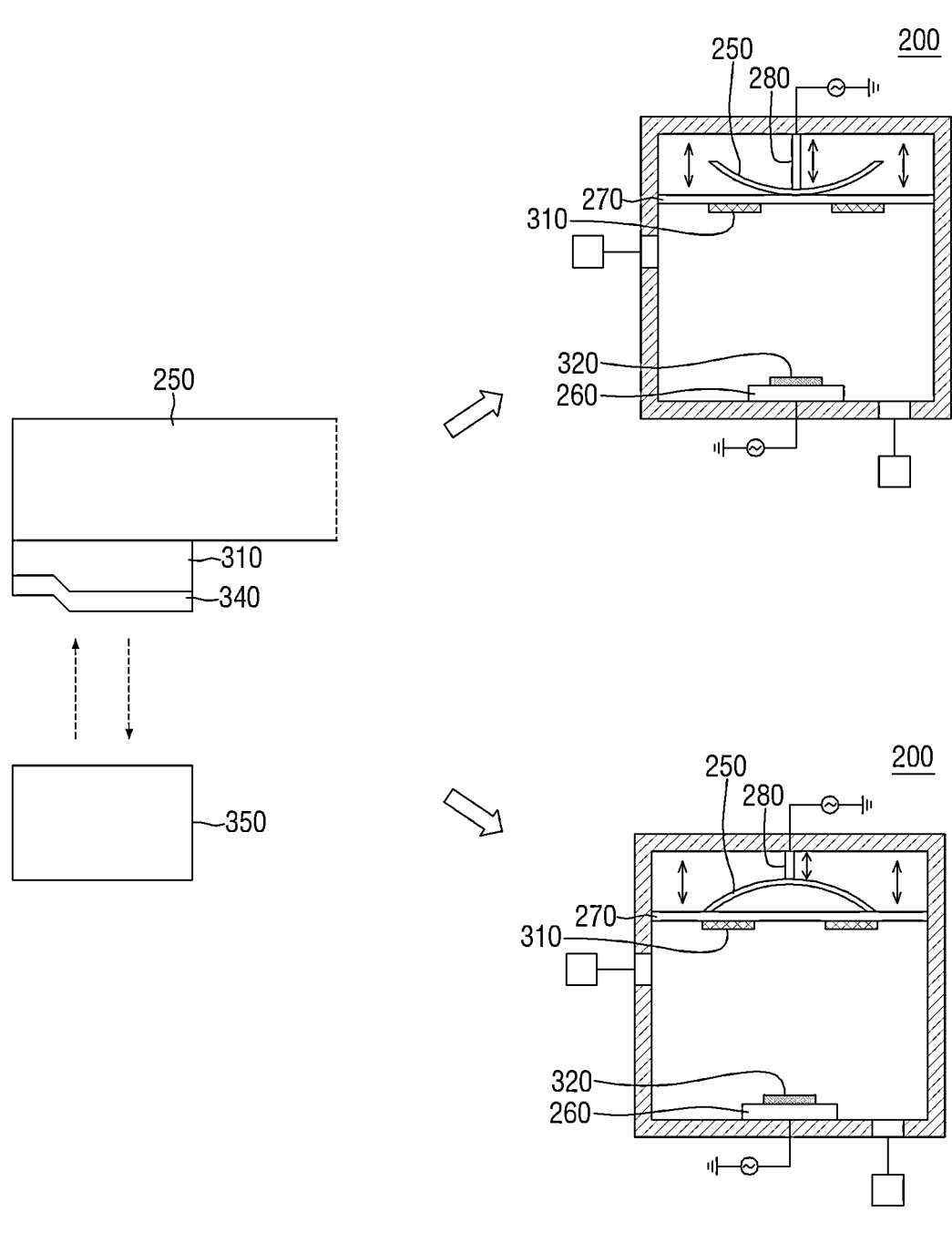
FIG. 13 is an example diagram for explaining various operation methods of a metal substrate constituting a consumable component treating apparatus using plasma.

12 thickness of the coating layer 340 can be measured in real time by using a thin film thickness measurement module 350 such as a QCM (Quartz Crystal Microbalance). FIG. 13 is an example diagram for explaining various operation methods of a metal substrate constituting a consumable component treating apparatus using plasma.

The present invention relates to a flexible substrate electrode for improving the thickness uniformity and step coverage of PVD coating. During PVD deposition, deposition particles move in a straight line, so deposition efficiency may decrease as the distance increases. In addition, during PVD deposition, thickness uniformity at slope and step areas decreases, so step coverage needs to be improved. In addition, there is a need to improve the structure to be optimized to the shape of the base material 310.

In the present invention, overall thickness uniformity can be secured by controlling the deposition distance between the center area and the edge area on the base material 310 using a flexible substrate, that is, a flexible metal substrate 250, and applicability for each part shape can be expanded.

In addition, the deposition efficiency can be improved in thickness vulnerable areas by adjusting the straight-line distance of the deposition particles according to the degree of bending of the metal substrate 250, and depending on the shape of the base material 310, the curvature of the metal substrate 250 can be adjusted to form an intensive coating area or a coating relief area to respond to various shapes. Additionally, the present invention can minimize waste of target material 320.

Although embodiments of the present invention have been described above with reference to the attached drawings, the present invention is not limited to the above embodiments and can be manufactured in various different forms, and those skilled in the art can understand that the present invention can be implemented in other specific forms without changing its technical spirit or essential features. Therefore, the embodiments described above should be understood in all respects as illustrative and not restrictive.

What is claimed is:

1. An apparatus for processing a component comprising:
a housing;
a process gas providing unit configured to provide process gas to an interior of the housing;
a plasma generating unit including a high-frequency power source and configured to generate plasma inside the housing using the process gas;
a holder configured to fix a base material, the holder being a ceramic material;
a metal substrate adjacent to the holder opposite and separated from the base material;
a support shaft configured to electrically connect the metal substrate and the high-frequency power source; and
a support module configured to support a target material, the plasma generating unit configured to generate the plasma to coat the target material on the base material via sputtering,
wherein the metal substrate is configured to be bendable relative to the holder,
wherein the metal substrate is bendable in a first bending direction and a second bending direction,
wherein, based on the target material being coated on a center area of the base material, the metal substrate is configured to alter a distance between an edge area of the metal substrate and the holder, and wherein the metal substrate is configured to alter a distance between a center area of the metal substrate and the holder based on the metal substrate being bent in the first bending direction or the second bending direction.

2. The apparatus of claim 1, wherein, based on the target material being coated on the center area of the base material, the metal substrate is configured to alter the distance between the edge area of the metal substrate and the holder.

3. The apparatus of claim 1, wherein, based on the target material being coated on an edge area of the base material, the metal substrate is configured to alter the distance between the center area of the metal substrate and the holder.

4. The apparatus of claim 1 further comprises, a thin film thickness measurement module configured to measure a thickness of a coating layer formed on the base material by the target material.

5. The apparatus of claim 4, wherein a bending direction of the metal substrate is determined according to a thickness measurement result of the coating layer.

6. The apparatus of claim 1, wherein the metal substrate comprises at least one metal of aluminum, copper, and iron.

7. The apparatus of claim 1, wherein the holder is configured to fix the base material using any one of a clamp and bolting.

8. The apparatus of claim 1, wherein the holder is formed in a mesh shape.

9. The apparatus of claim 1, wherein the holder comprises a $Al_2O_3$.

10. The apparatus of claim 1, wherein the support shaft is configured to reciprocate in a direction parallel to an arrangement direction between the base material and the target material to bend to metal substrate.

11. The apparatus of claim 1, wherein the base material comprises a ceramic component or a metal component.

12. The apparatus of claim 1, wherein the base material is formed into a ring shape.

13. A semiconductor manufacturing equipment comprising:

process chambers configured to process a semiconductor substrate; and the apparatus as recited in claim 1 configured to treat the component installed in at least one of the process chambers.

14. An apparatus for processing a component comprising:

a housing;

a process gas providing unit configured to provide process gas to an interior of the housing;

a plasma generating unit including a high-frequency power source and configured to generate plasma inside the housing using the process gas;

a holder configured to fix a base material;

a metal substrate adjacent to the holder, separated from the base material, the metal substrate is configured to bend;

a support module configured to support a target material, the plasma generating unit configured to generate the plasma to coat the target material on the base material via sputtering;

a support shaft configured to electrically connect the metal substrate and the high-frequency power source;

a thin film thickness measurement module configured to measure a thickness of a coating layer formed on the base material by the target material; and a process controller configured to control the apparatus to bend the metal substrate based on a result of measuring the thickness of the coating layer, wherein the metal substrate is configured to bend in a first bending direction to reduce a center distance between a center area of the metal substrate and the holder and to increase an edge distance between an edge area of the metal substrate and the holder, and wherein the metal substrate is configured to bend in a second bending direction to increase the center distance and reduce the edge distance.

* * * * *